United States Patent [19]

McCarthy et al.

[11] Patent Number: 5,761,215
[45] Date of Patent: Jun. 2, 1998

[54] SCAN BASED PATH DELAY TESTING OF INTEGRATED CIRCUITS CONTAINING EMBEDDED MEMORY ELEMENTS

[75] Inventors: Daniel M. McCarthy, Phoenix, Ariz.; Paul W. Hollis, Austin, Tex.; Ruey J. Yu, Austin, Tex.; Renny L. Eisele, Austin, Tex.

[73] Assignee: Motorola, Inc., Schaumburg, Ill.

[21] Appl. No.: 888,384

[22] Filed: Jul. 7, 1997

Related U.S. Application Data

[63] Continuation-in-part of Ser. No. 868,340, Jun. 3, 1997.
[51] Int. Cl.[6] .................................................. G06F 11/00
[52] U.S. Cl. ............................................................. 371/22.31
[58] Field of Search ............................... 371/22.31, 22.32, 371/22.1, 22.34, 22.36; 395/183.06

[56] References Cited

U.S. PATENT DOCUMENTS

| 5,068,603 | 11/1991 | Mahoney | 371/22 |
| 5,592,493 | 1/1997 | Crouch et al. | 371/22.3 |

Primary Examiner—Vincent P. Canney
Attorney, Agent, or Firm—Bruce E. Hayden; Craig J. Yudell

[57] ABSTRACT

Accurate delay testing of integrated circuits containing memory arrays embedded in combinational logic utilizes actual memory array timing. Actual memory timing signals provide the timing for bypassing the memory in SCAN Mode. The result is that simulated memory accesses during SCAN Mode testing have the same timing as actual memory accesses have during functional mode operation. Thus delay testing during SCAN Mode through paths containing both combinational logic and memory arrays accurately determines path delays.

21 Claims, 7 Drawing Sheets

5,761,215

SCAN BASED PATH DELAY TESTING OF INTEGRATED CIRCUITS CONTAINING EMBEDDED MEMORY ELEMENTS

This application is a continuation-in-part of our copending patent application entitled "SCAN BASED PATH DELAY TESTING OF INTEGRATED CIRCUITS CONTAINING EMBEDDED MEMORY ELEMENTS" filed Jun. 3, 1997 as Ser. No. 08/868,340 assigned to the assignee hereof.

FIELD OF THE INVENTION

The present invention generally relates to integrated circuit testing, and more specifically to testing integrated circuits that contain memory arrays embedded within combinational logic.

BACKGROUND OF THE INVENTION

FIG. 1 is a block diagram illustrating the manufacture of Integrated Circuits (ICs). A design database 504 results from the design process 502. Currently, most design is done using CAD tools. The design database 504 is utilized to generate lithographic masks 506. The lithographic masks are used to pattern, and ultimately manufacture a number of integrated circuit devices on wafers. After probe testing, the wafers are cut up into the individual integrated circuit devices. These are then packaged, step 508. The IC devices are then tested, step 514 using Test Vectors 512 generated by ATPG tools 510 from the design database 504. If the IC devices pass the tests, step 516, they are accepted, 518. Otherwise, they are rejected, 519. At this point in the production flow, a number of different tests are performed, including speed tests. Also note that in some instances, 100% of the Integrated Circuit devices are tested, while in some other instances, only randomly selected samples are tested.

It is desirable to test 514 an integrated circuit (IC) for correct operation and correct speed of operation quickly, cheaply and with tool-generated tests. Automatic test pattern generation (ATPG) tools 510 exist that provide SCAN based tests for both fault coverage and speed coverage, called path delay testing.

SCAN based testing for both fault coverage and speed-of-operation coverage is widely used in ICs. It provides a methodology for adding test circuits to a design that allow at least a portion of the state of an IC to be controlled and observed using this added circuitry. SCAN testing is then done by enabling the SCAN circuitry, using it to initialize the IC to at least a partially known state, giving the IC some number of normal functional mode clocks and finally using the SCAN circuitry to observe at least part of the resulting state. This result is then compared against what it should be based on some "golden" model. By controlling the initialized state and observing the resulting state, possible faults resulting from a variety of defects can be detected.

Further, if the normal functional clocks given during SCAN testing can be at the desired operating frequency for the IC and the SCAN test can be run in a manner that covers a timing arc in the IC, the frequency of operation of that timing arc can be tested. This is called SCAN based path delay testing. As a larger portion of an IC is controllable and observable from SCAN, the fault coverage and speed coverage of SCAN based testing improves.

However, ICs with embedded memory elements present problems for ATPG tools 510. ATPG tools have difficulty modeling the memory elements and fail to produce tests that can initialize and control the outputs of the memory elements in an acceptable number of patterns. Because of this, ATPG tools 510 can not generate tests to cover combinatorial logic associated with an embedded memory element.

Two primary testing problems arise when testing logic with embedded memory elements. First, there is a question of functional correctness. More importantly though, the speed at which an integrated circuit device can operate is limited by the slowest path through the device. This is often called the "speed path". This speed path often contains embedded memory elements when they are present in the integrated circuit.

FIG. 2 is a block diagram illustrating this problem. It shows one set of timing arcs from a logic design with SCAN. SCAN testing operates by loading or initializing scanable registers 520, 522 with data from the test vectors 512. The logic being tested is operated for one or two cycles. The combinational logic 524, 526, 530 is executed during the one or two cycles, and the results captured in another scanable register 532. For two clock testing, information may flow into registers 520, 522 from other SCAN controlled logic. The captured results are then scanned out of the scanable register 532 and compared to expected results from the test vectors 512. It should be understood here that the use of scanable registers 520, 522, 532 is illustrative. This invention operates equally well with any SCAN-loadable or SCAN-readable memory devices, such as latches and flip-flops. Henceforth, the terms "scanable registers", "scanable elements" and "scanable memory elements" shall all be considered to include all bistable devices that can be loaded or unloaded via SCAN.

Serious testing problems arise however when embedded memory 528 is introduced into an Integrated Circuit. For example, in FIG. 2, removing the memory element input to combinatorial logic 530 and testing of Path D alone, which contains combinational logic 526, 530 between scanable register 522 and scanable register 532 is relatively well established. However, the problems arise when memory elements 528, such as SRAM or DRAM are embedded. In the example in FIG. 2, the Path B memory elements 528 are embedded between Path A combinational logic 524 and Path C combinational logic 528.

The memory element contains a memory state that is not initialized by SCAN. Memory elements are built to be as dense as possible and for most cases, SCAN logic on each memory cell would be prohibitive in terms of size. Therefore, SCAN can not directly control the starting state of the memory element or observe changes to that state. Using SCAN to control a sequencer to try to define the memory state also has problems. This adds cost in terms of circuit size and test time. It may negatively impact the critical timing path in the memory. ATPG tools may not be able to understand or use the initial state without added development work. Finally, it may not be possible to load enough patterns to fully test all associated logic.

These considerations limit SCAN's ability to observe inputs to a memory element and control outputs from a memory element. In FIG. 2, memory element 528 blocks SCAN testing between scanable registers 520 and 532 along Path A plus Path B plus Path C. This memory element also degrades the SCAN test coverage between scanable registers 522 and 532 along PATH D since the memory element 528 inputs to combinatorial logic 530 are not controllable.

Methods exist today to provide SCAN observability of embedded memory element inputs and control of embedded memory element outputs. Inputs may be observed by adding scanable monitor registers to all inputs, allowing fault coverage of logic driving the array.

Outputs may be controlled by using simple SCAN controlled MUXes to select between the array outputs or a controllable signal. This provides fault coverage of combinatorial logic downstream from the memory element. This method does not provide speed coverage since the output of this new MUXing logic is different for functional and SCAN modes.

Other test methods must be used to provide speed coverage in these areas. These other test methods can add design time, add circuits, add test programming, and possibly may require more expensive testers. Current ICs with embedded memories employ many different methods to speed test the embedded memories and their interface to other circuits. Functional testing uses tests written for the normal operational mode of the IC to test the embedded memory and its interface to other circuits. These are time consuming tests to design and normally require intimate knowledge of the entire IC. It is also difficult to achieve high speed coverage. Any design or circuit change may invalidate the test. Also, if more speed paths are discovered at some later time or new speed paths are created by process changes, a whole new test design cycle may be needed.

Another testing method used is called ADHOC testing. This involves adding control and data paths to all embedded memory elements on an IC such that the memory elements may be written and read from the pins of the part. If the ADHOC tests can be run at functional speed, this memory testing method speed tests the embedded memory elements and any control and data path common to functional and ADHOC mode. Any logic associated with the memory elements that is not common or is not used in the same manner between functional and ADHOC mode is not fully tested by this method.

Sometimes it is not possible to run ADHOC type logic at the functional speed of the memory elements because the embedded memory elements are running at an internal clock frequency which is higher than any pins of the part can support.

A third testing method is memory element Built-In Self Test (BIST). Like ADHOC testing, if BIST can be run at functional speed ("at-speed" testing), it can speed test any control and data path common to functional and BIST mode. Other functional mode logic will not be covered. Referring back to FIG. 2, BIST testing is capable of testing standalone memory elements 528, but not in combination with combinational logic 524, 530.

One major problem with BIST and ADHOC testing of embedded memories is that these two methods do not provide a capability of testing combinational logic associated with the embedded memory at speed.

BRIEF DESCRIPTION OF THE DRAWINGS

The features and advantages of the present invention will be more clearly understood from the following detailed description taken in conjunction with the accompanying FIGs. where like numerals refer to like and corresponding parts and in which.

DETAILED DESCRIPTION

In the following description, the term "bus" will be used to refer to a plurality of signals or conductors which may be used to transfer one or more various types of information, such as data, addresses, control, or status. The terms "assert" and "negate" will be used when referring to the rendering of a signal, status bit, or similar apparatus into its logically true or logically false state, respectively. If the logically true state is a logic level one, the logically false state will be a logic level zero. And if the logically true state is a logic level zero, the logically false state will be a logic level one. For the most part, details concerning timing considerations and the like have been omitted inasmuch as such details are not necessary to obtain a complete understanding of the present invention and are within the skills of persons of ordinary skill in the relevant art.

The present invention allows standard SCAN-based path delay testing to be applied to a higher percentage of the non-array logic on an Integrated Circuit (IC) with embedded memory elements, specifically combinatorial logic either upstream and/or downstream from the memory element. This is done by providing SCAN control of a memory array such that the array outputs are controllable, observable and have the same speed of operation as functional mode. Some of the advantages that this invention provides are:

1) Reduced time, effort and circuit cost needed to create and maintain speed tests for ICs with embedded memory elements.
2) Improved speed test coverage for ICs with embedded memory elements.
3) Reduced tester time and cost needed to speed test ICs with embedded memory elements.

Figure 3:
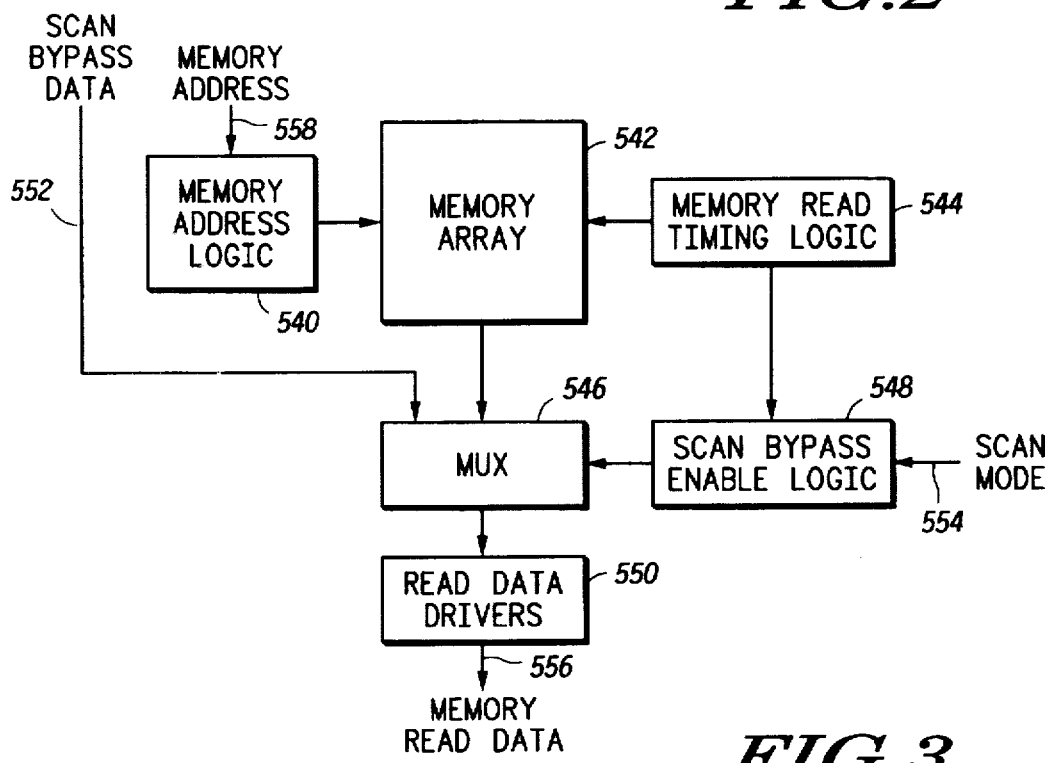
FIG. 3 is a block diagram that illustrates the present invention method of testing integrated circuit (IC) devices.

A memory array holds a plurality of logic states and provides a portion of these states in response to an address input. Examples of memory arrays that are known in the art include but are not limited to SRAMs (static random access memories), DRAMs (dynamic random access memories), ROMs (read only memories), FLASH memories, etc. FIG. 3 is a block diagram that illustrates the present invention method of testing integrated circuit (IC) devices. It shows a general block diagram of a memory array plus additions found in the present invention. The memory cell array 542 is the collection of circuits that hold the memory array state. The memory address logic 540 receives the address to a portion of the memory cell array and contains logic to select the desired portion. The selected memory cell array element's content is then driven out of the memory array, normally by read data drivers 550. The memory read timing logic controls the memory array read sequence. This may be from external clock or strobe inputs, from internal self-timed logic or may be just controlled by the access time of the memory cell array plus the address logic plus the data drivers. Write logic, required for writable memory arrays, is not shown.

The present invention consists of SCAN control inputs to the memory array(s) that reduce the functional model of the memory array to a level that can be understood by ATPG tools while maintaining output timing that is equivalent to the read timing of the memory array in functional mode. FIG. 3 is a block diagram that illustrates the present invention method of testing integrated circuit (IC) devices. A memory address 558 is provided to Memory Address Logic 540. In functional mode, the memory address logic 540 drives reads and writes to and from a Memory Array 542. The Memory Array 542 is also driven by Memory Read Timing logic 544. The Memory Read Timing logic 544 is used to drive Scan Bypass Enable logic 548, which is enabled by a SCAN Mode signal 554. The Scan Bypass Enable logic 548 controls a MUX 546, which selects output from either Scan Bypass data 552, or the Memory Array 542, depending on whether the SCAN Mode signal 554 is being asserted. The output from the MUX 546 is provided to Read Data Drivers 550, which in turn generate Memory Read Data signals 556. The Memory Read Data signals 556 are the output signals from the memory elements 528. One critical element in the present invention is that the timing of the Scan Bypass Data signals 552 is controlled by the Memory Read Timing logic 554, just as are function mode memory reads. Thus, the timing of bypassing the Memory Array 542 in SCAN Mode 554 is identical to the timing of memory reads in function mode.

Figure 4:
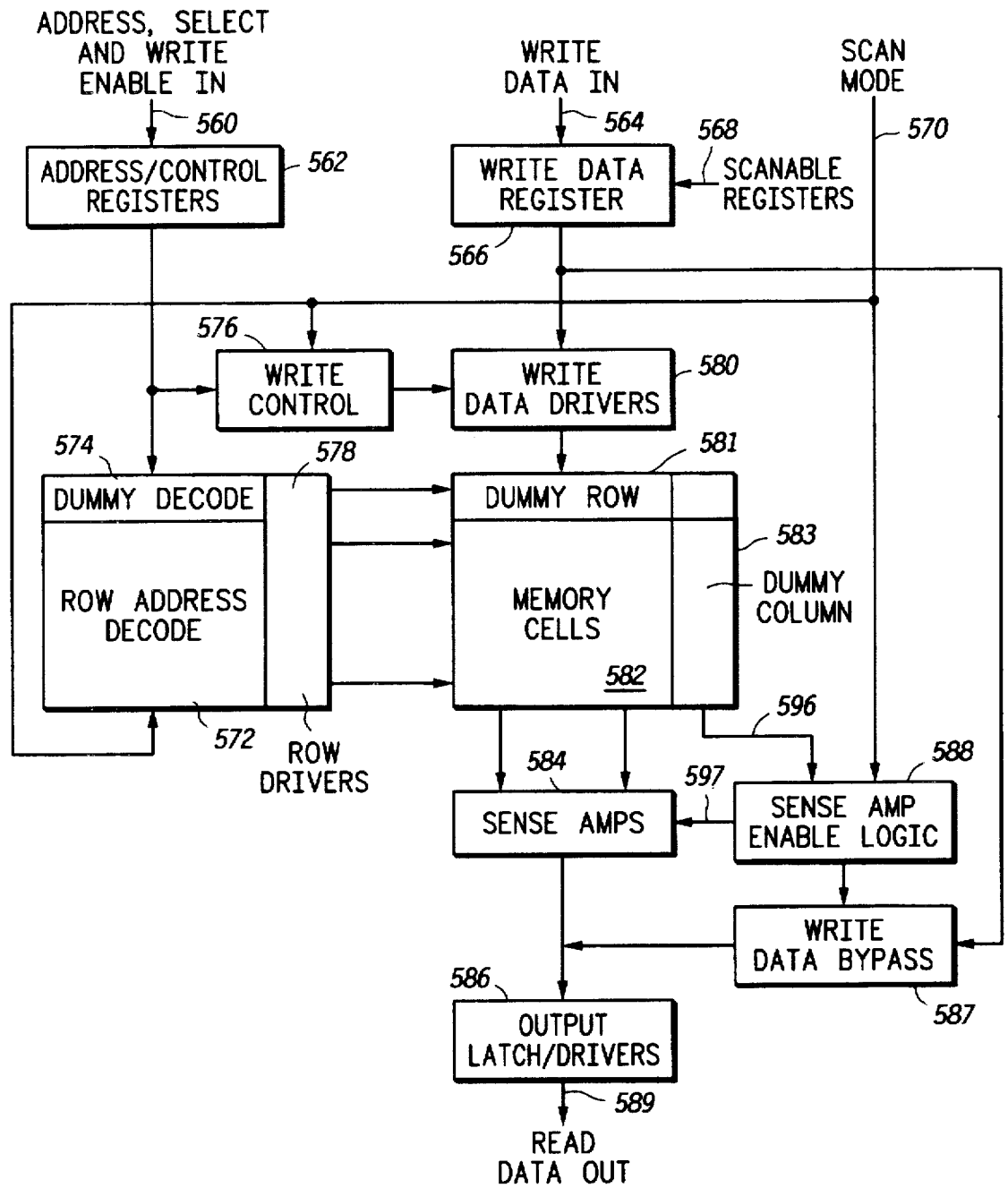
FIGS. 4, 5, and 6 are block diagrams that illustrate different embodiments of the present invention using synchronous, self-timed memory elements.
Figure 5:
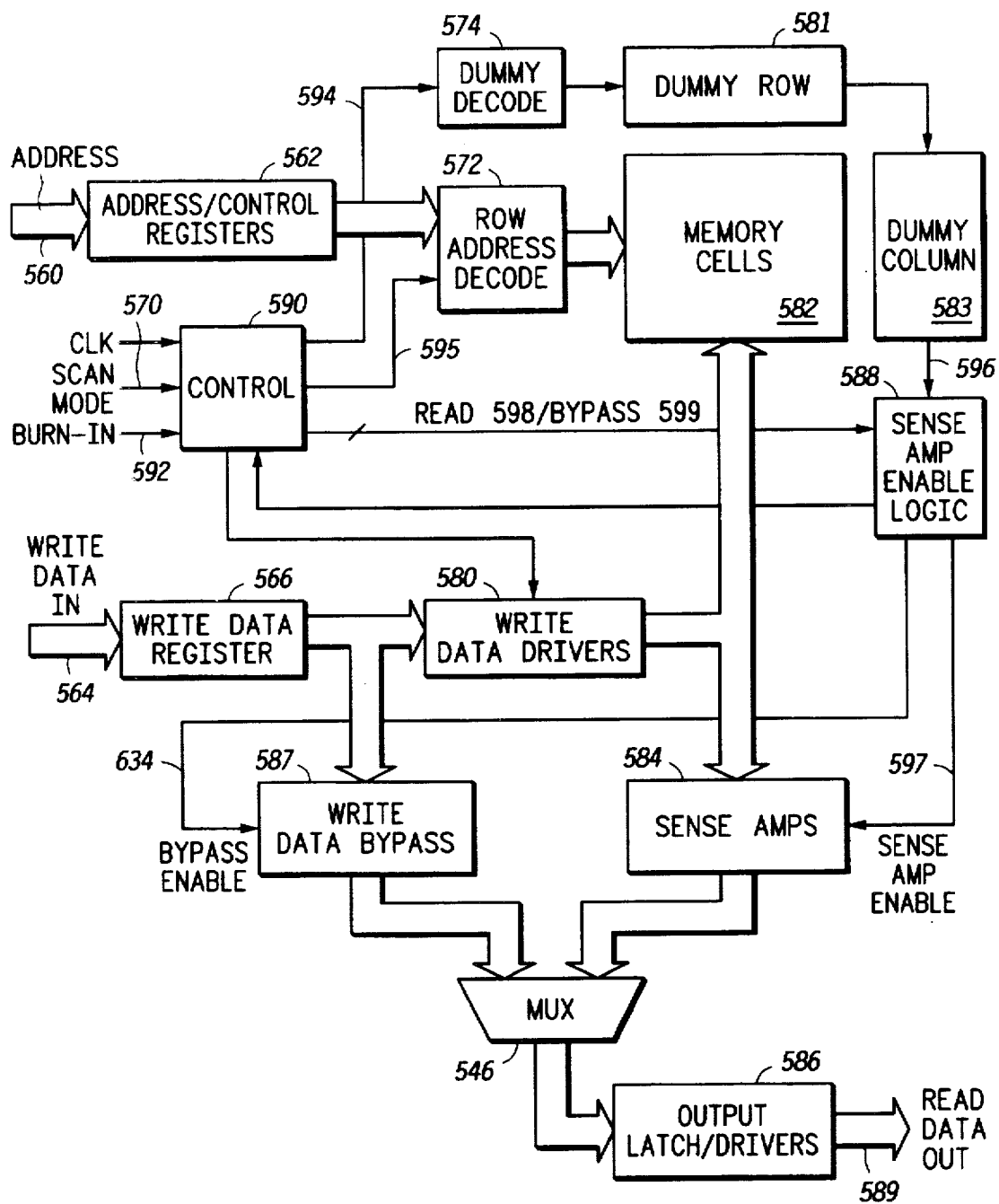
Figure 6:
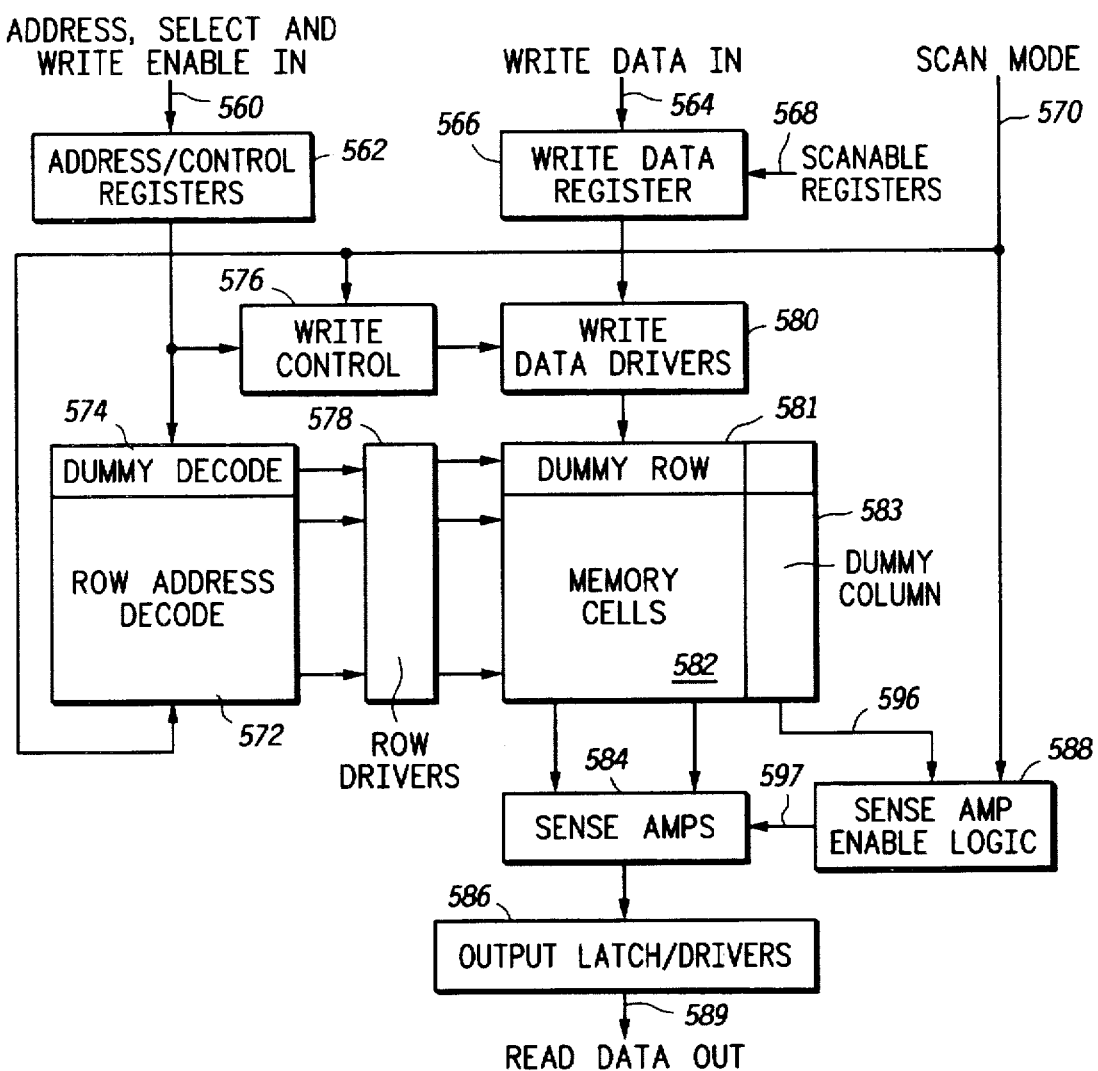

FIGS. 4, 5, and 6 are block diagrams that illustrate two different embodiments of the present invention using synchronous, self-timed memory elements. Such self-timed memory is the type of memory array that is used in the initial implementation of this invention. FIGS. 4 and 5 are different views of a first embodiment, whereas FIG. 6 illustrates a second embodiment of the present invention.

In FIGS. 4 and 5, Address Select and Write Enable signals 560 are registered in memory Address/Control registers 562. The Address/Control registers 562 provide control and addresses to Row Address Decode circuitry 572 and to Write Control circuitry 576. The Row Address Decode circuitry 572 drives Row Drivers 578, which in turn control row operations to memory cells 582. Write Data drivers 580 are responsively coupled to and controlled by the Write Control logic 576. The Write Data drivers 580 writes the Write Data In signal 564 registered in the Write Data register 566 to specified locations in the memory cells 582. Note that the Write Data register 566 is also responsively coupled to other scanable registers 568.

The memory cells 582 in FIGS. 4, 5, and 6 are self-timed. This can be done by providing timing via a Dummy Row 581 and Dummy Column 583. The Dummy Row 581 and Dummy Column 583 are worst case situations, and therefore provide a constant minimum worst case timing bound for accessing the memory. Access to the Dummy Row 581 is controlled by Dummy Decode logic 574 in the Row Address Decode circuitry 572. The resulting signal 596 controls Sense Amp Enable logic 588, which generates a Sense Amp Enable signal 597 to in turn trigger sense amps 584 to read memory cells 582. The output from the sense amps 584 is latched via a tri-state mux 546 in the Output latch/drivers 586, which in turn provides the Read Data Output signals 589. Note that though self-timed memories are illustrated in FIGS. 4, 5, and 6, this is done for illustrative purposes. The present invention will also work with other types of memory timing.

Figure 1:
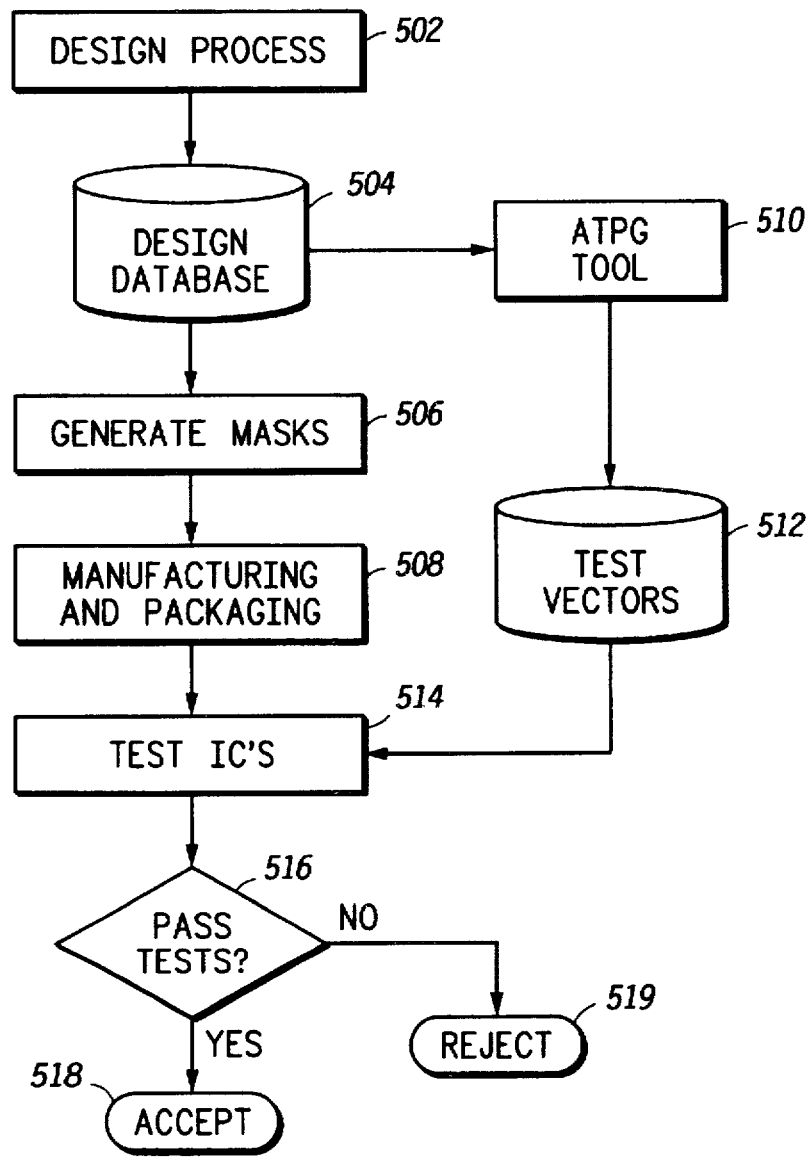
FIG. 1 is a block diagram illustrating the manufacture of Integrated Circuits (ICs)
Figure 2:
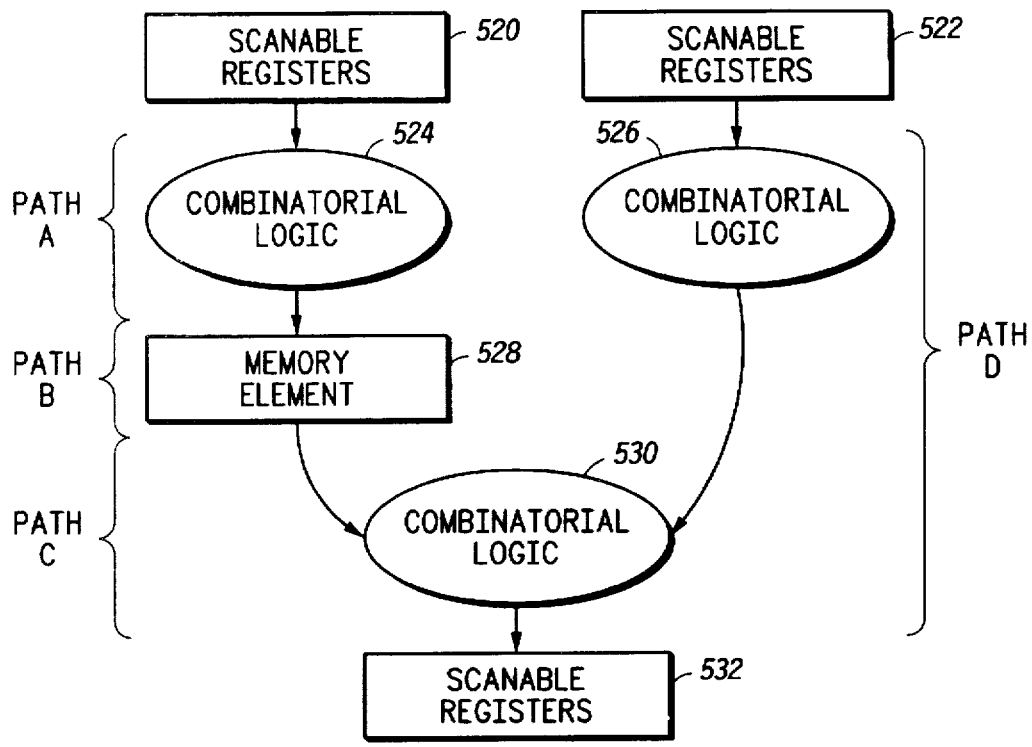
FIG. 2 is a block diagram illustrating the problem solved by this invention. It shows one set of timing arcs from a logic design with SCAN.

When a SCAN Mode signal 570 is asserted, the Row/Address Decode circuitry 572 receives the SCAN Mode signal 570 and generates a Dummy Decode signal to the Row Drivers 578, memory cells 582, and ultimately via the Dummy Row and Dummy Column, the Sense Amp Enable logic 588 (see FIG. 4). The Sense Amp Enable logic 588 provides signals to enable a Write Data Bypass circuit 587, which allows bypass of the output from the Write Data register 566 around the memory cells 582 directly via the tri-state mux 546 to the Output latch/drivers 586. Note that this allows the Write Data Bypass circuit 587 to utilize the same worst case timing as is utilized in functional mode when reading actual data from the memory cells 582. Thus, since timing is maintained when bypassing memory cells 582 in SCAN Mode and the bypassed data comes from Write Data register 566 which is scanable and therefore a controllable data source, the present invention provides a method of at-speed testing paths that contain memory elements 528 embedded within combinational logic 524, 530 (see FIG. 2).

FIG. 5 additionally illustrates Bypass Control logic 590 which receives as input signals a Clock, the SCAN Mode signal 570, and a Burn-In signal 592. The Burn-In signal 592 controls Burn-In mode which decouples the memory cells 582 from the remaining logic. This allows the memory array to remain quiescent for memory retention testing simultaneously with SCAN testing logic or allows BIST self testing memory simultaneously with SCAN testing logic. The Bypass Control logic 590 provides a Timing Enable signal 594 to the Dummy Decode circuit 574, a Row Enable signal 595 to the Row Address Decode circuit 572, and both Read 598 and Bypass 599 signals to the Sense Amp Enable logic 588.

FIG. 6 is a block diagram illustrating a second embodiment of the present invention. FIG. 6 is identical to FIG. 4 with the exception that the dedicated Write Data Bypass circuitry 587 is eliminated. Instead, the SCAN Mode signal 570 is received by the Write Control circuitry 576. The Write Data drivers 580 are used to drive through the memory cell array 582 providing a path to the sense amps 584.

Thus, a SCAN controllable path is created in the memory element such that the Write Data input (or a SCAN Control register input for a ROM type memory element) is passed through the memory cell array to the output drivers. This provides the controllability of the memory array output.

This path is further controlled by the memory array timing logic. This timing logic may be from a clock source (if used) or self timing logic (as shown in both FIG. 4 and 6) that mimics the worst array access path. The timing logic is forced active by SCAN Mode while the array cell row logic is forced inactive. In this way, the array outputs during SCAN testing have the same timing as in functional mode.

With these additions, the function of the memory array in FIGS. 4, 5, or 6 in SCAN Mode is logically reduced to a simple delay function, where the delay from the array Write Data input to the array Read Data output is the same as a normal functional array read operation. (see FIG. 7)

For FIGS. 4 and 5, this logically reduced functionality is performed by disabling the write drivers whenever in SCAN Mode. The output of the Write Data register 566 is tri-stated or multiplexed with the output of the sense amps 584. This tri-state or multiplexed connection is controlled by the Sense Amp Enable logic 588. This logic uses the SCAN Mode signal 570 to select between Sense Amp 584 outputs or the Write Data register 566 output when the self-timing logic is activated. The final change necessary is to add SCAN Mode control to the memory array address decode logic such that during SCAN Mode the Dummy Row driver 581 is enabled every cycle while the Row drivers 578 are forced inactive. The Sense Amp Enable logic 588 still uses the output of the Self-Timing logic.

For FIG. 6, this logically reduced functionality is performed by enabling the write drivers whenever in SCAN Mode. The Write Data drivers 580, when in SCAN Mode, will then drive the output of the Write Data register 566 through the memory cell array 582, which is inactive, to the memory array output. Again, the memory array address decode logic is controlled by SCAN Mode such that the Dummy Row driver 581 is enabled every cycle while the Row drivers 578 are forced inactive. The Sense Amp Enable logic 588 works as in functional mode. However, instead of sensing the output of a memory cell 582, the sense amps 584 will sense the write data and pass it to the output latch/drivers when the Sense Amp Enable logic 588 is activated.

Figure 7:
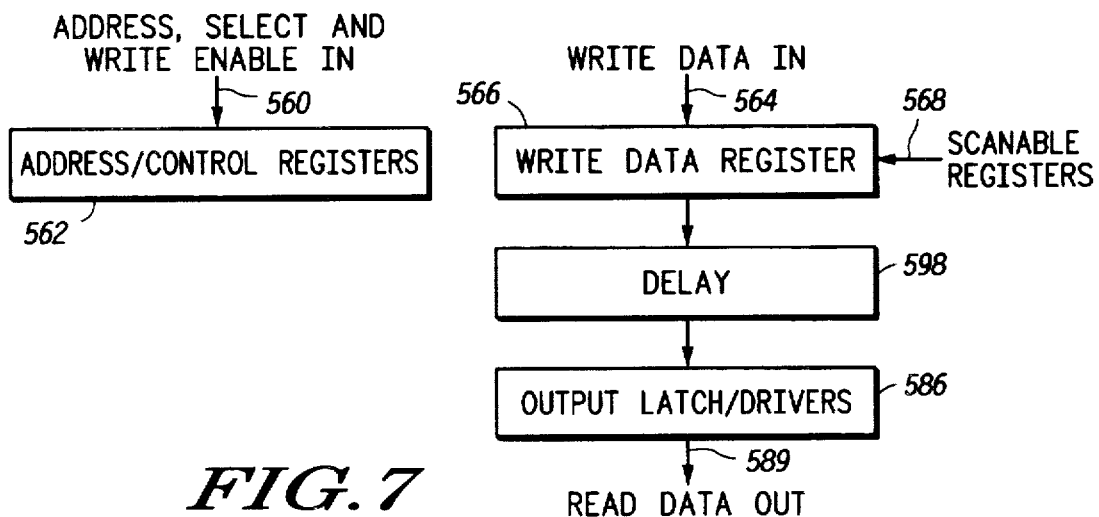
FIG. 7 is a block diagram that illustrates the ATPG model of the memory array in SCAN mode for the present invention.

FIG. 7 is a block diagram that illustrates the ATPG model of the memory array 542 in SCAN Mode for the present invention. The memory array function has been reduced to that of a scanable register whose clock to output timing matches the clock to read data of the memory array in functional mode. This allows path delay testing of Path A, the time critical arcs in Path B, and Path C in FIG. 2. Note also that the content of the memory array 542 is not disturbed by this testing. This allows SCAN path delay testing to be done in parallel with memory retention testing.

Figure 8:
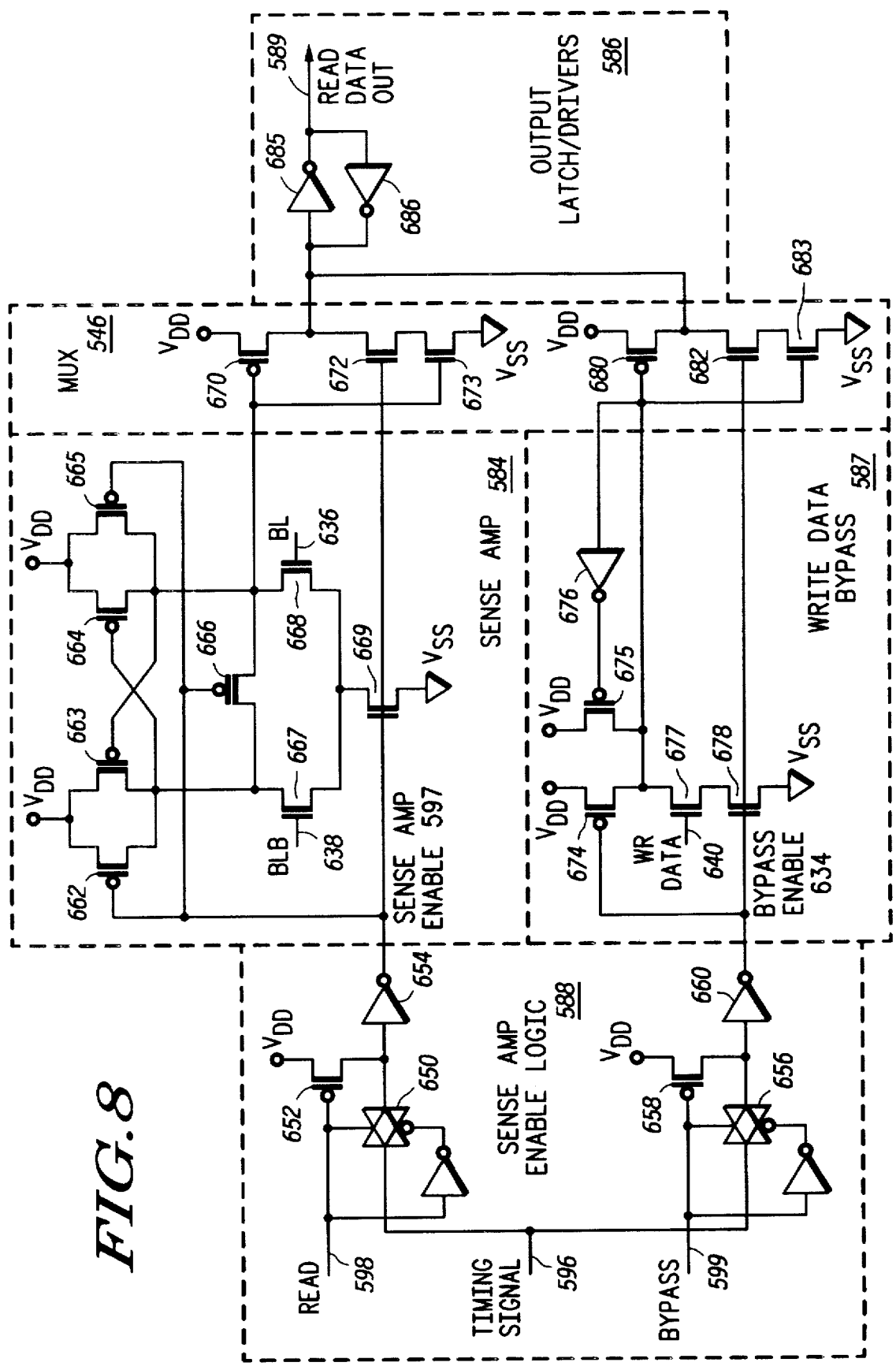
FIG. 8 is a circuit diagram that further illustrates relevant portions of the sense amp enable logic, sense amps, write data bypass, and output latch/drivers of FIG. 5.

FIG. 8 is a circuit diagram that further illustrates relevant portions of the Sense Amp Enable logic 588, sense amps 584, Write Data Bypass 587, mux 546, and output latch/drivers 586 of FIG. 5. The Sense Amp Enable Logic block 588 includes a multiplexer which uses the inputs timing signal 596, read 598, and bypass 599 to determine the values of Outputs Sense Amp Enable 597 and Bypass Enable 634. The Sense Amps block 584 detects the state of bitline (BL) 636 and bitline bar (BLB) 638 when Sense Amp Enable 597 is asserted. The Sense Amps block 584 outputs the value of BL to the mux block 546. The Write Data Bypass block 587 propagates the value of the Input Write ("WR") data 640 to the output of the Write Data Bypass block 587 when Bypass Enable 634 is asserted. The output of the Write Data Bypass block 587 then feeds into the mux block 546. The mux block 546 includes a tristate mux that outputs either the output of the Sense Amps block 584 or the output of the Write Data Bypass block 587 (depending on whether Sense Amp Enable 597 or Bypass Enable 634 is active) to the input of the Output latch/drivers block 586. The propagation delay of the Write Data Bypass block 587 is extremely close to the propagation delay of the Sense Amps block 584 so that the output of the Output latch/drivers block 586, Read Data Out 589, will appear at the same time regardless of which data path was selected (Sense Amps block 584 or Write Data Bypass block 587).

An example embodiment of the above description is illustrated in FIG. 8. Timing signal 596 feeds two complementary pass gates 650 and 656. Read 598 is the select of complementary pass gate 650 and also attaches to the gate of p-channel transistor 652 whose source connects to $V_{DD}$. The drain of transistor 652 and the output of pass gate 650 join together and form the input to inverter 654 whose output is Sense Amp Enable 597. Bypass 599 is the select of complementary pass gate 656 and also attaches to the gate of p-channel transistor 658 whose source connects to $V_{DD}$. The drain of transistor 658 and the output of pass gate 656 join together and form the input to inverter 660 whose output is bypass enable 634. Sense Amp Enable 597 is the input to the gates of p-channel transistors 662, 665, and 666 and n-channel transistors 669 and 672. The sources of p-channel transistors 662, 663, 664, 665, 670, 674, 675, and 680 connect to $V_{DD}$, and the sources of n-channel transistors 669, 673, 678, and 683 connect to $V_{SS}$. The drain of transistor 669 connects to the source of n-channel transistors 667 and 668. BLB 638 connects to the gate of transistor 667 and BL 636 connects to the gate of transistor 668. The drains of transistors 667, 666, 662, and 663 and the gate of transistor 664 are all connected. The source of transistor 666, the drains of transistors 668, 665, 664, and the gates of transistors 663, 670, and 673 are connected. The drain of transistor 673 connects to the source of transistor 672. Bypass Enable 634 connects to the gates of transistors 674 and 678, and gate of n-channel transistor 682. Write ("WR") Data 640 connects to the gate of n-channel transistor 677, whose source connects to the drain of transistor 678. The drain of transistor 677 connects to the drain of transistors 674 and 675, the gates of transistors 683 and 680, and the input to inverter 676. The output of inverter 676 connects to the gate of transistor 675. The drain of transistor 683 connects to the source of transistor 682. The drains of transistors 680, 682, 670, and 672 join to form the output of the mux block 546. The output of the mux block 546 feeds into the input of the Output latch/drivers block 586 which connects to the input of inverter 685 and the output of inverter 686. The output of inverter 685 is read data out 589 and connects to the input of inverter 686.

Figure 9:
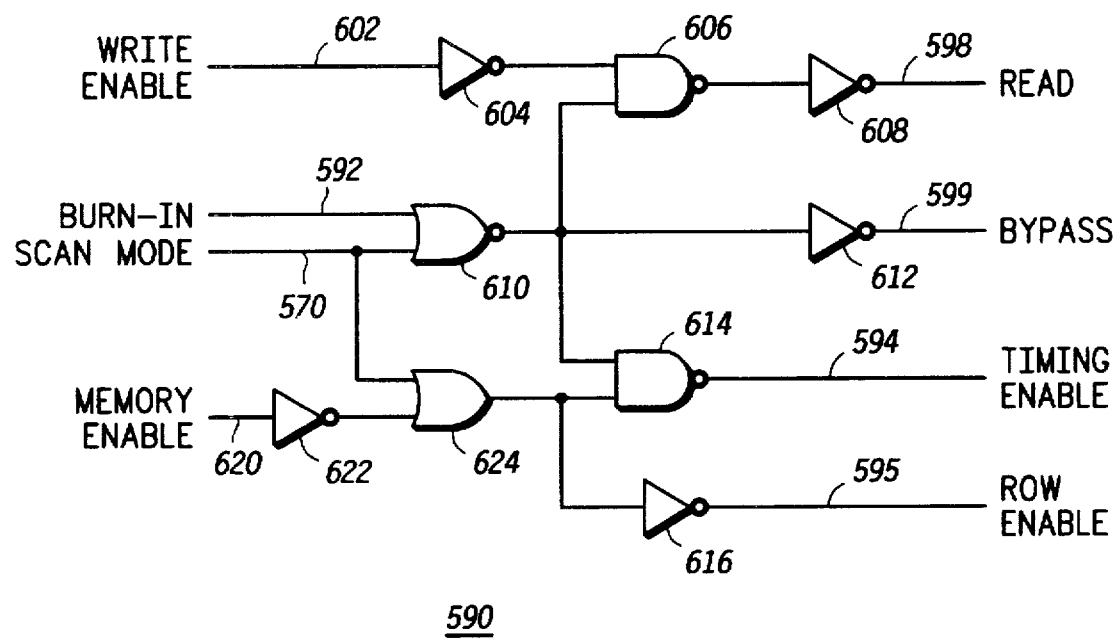
FIG. 9 is a circuit diagram illustrating a portion of the control block 590 as shown in FIG. 5.

FIG. 9 is a circuit diagram illustrating a portion of the control block 590 as shown in FIG. 5. The inputs to this portion of the circuit include Write Enable 602, Burn-In 592, SCAN Mode 570, and Memory Enable 620. The outputs driven by this portion of the circuit include Read 598, Bypass 599, Timing Enable 594, and Row Enable 595. When Burn-In 592, SCAN Mode 570, or both are asserted, Bypass 599 is active. When Write Enable 602 is asserted, Read 598 is always inactive. If Write Enable 602 is not asserted, then Read 598 will be active when neither Burn-In 592 nor SCAN Mode 570 is asserted. Whenever Memory Enable 620 is asserted and SCAN Mode 570 is not asserted, Row Enable 595 is active. When Memory Enable 620 is not asserted, Row Enable 595 is not active. When Burn-In 592, SCAN Mode 570, or both are asserted and/or Memory Enable 620 is asserted, Timing Enable 594 is active.

An example embodiment of the above description is illustrated in FIG. 9. Write Enable 602 inputs into inverter 604 whose output is one of the two inputs to NAND gate 606. The output of NAND gate 606 then feeds into inverter 608 whose output is Read 598. Burn-In 592 and SCAN Mode 570 are the two inputs to NOR gate 610, whose output then feeds into the other input of NAND gate 606, inverter 612, and one of the two inputs to NAND gate 614. The output of inverter 612 is Bypass 599. Memory enable 620 feeds into inverter 622 whose output is one of the two inputs to OR gate 624. SCAN Mode 570 is the other input to OR gate 624, whose output is the other input to NAND gate 614 as well as the input to inverter 616. The output of NAND gate 614 is Timing Enable 594, and the output of inverter 616 is Row Enable 595.

The total delay time through the portion of the circuit illustrated in FIG. 8 remains constant regardless of the path taken. Since the outputs of the Sense Amp Enable logic block 588 are mutually exclusive and the sizing of pass gate 650, transistor 652, and inverter 654 is the same as the sizing of pass gate 656, transistor 658, and inverter 660, respectively, the timing signal 596 sees the same loading regardless of which path is enabled. Therefore, the timing of Sense Amp Enable 597 and Bypass Enable 634 are approximately equal. As mentioned above, the propagation delay of the Write Data Bypass block 587 is also exactly equal to the propagation delay of Sense Amps block 584. Sense Amp Enable 597 and Bypass Enable 634 see the same loading since transistors 669 and 672 are the same size as transistors 678 and 682, respectively, and the sizing of transistor 674 is equivalent to the combination of the sizings of transistors 662, 666, and 665. In order to ensure similar propagation times, transistors 677, 675, 680, and 683 can be sized as needed to compensate for differences in response due to the differences in circuitry between the Sense Amps block 584 and the Write Data Bypass block 587. BL 636 or Write ("WR") Data 640, depending on which path was selected, will appear at the output of the output Latch/Drivers block 586 as Read Data Out 589 with an almost identical delay time.

Those skilled in the art will recognize that modifications and variations can be made without departing from the spirit of the invention. Therefore, it is intended that this invention encompass all such variations and modifications as fall within the scope of the appended claims.

Claim elements and steps herein have been numbered and/or lettered solely as an aid in readability and understanding. As such, the numbering and/or lettering in itself is not intended to and should not be taken to indicate the ordering of elements and/or steps in the claims.

What is claimed is:

1. An integrated circuit device comprising:
   a test control circuit providing one or more test control signals and a timing enable signal;
   a set of one or more scanable elements receiving input data;
   a memory array in a same data path as the set of one or more scanable elements;
   a delay circuit having a signal delay representative of a memory array data propagation delay, wherein:
     the delay circuit receives the timing enable signal and outputs a timing signal that is equal to the timing enable signal delayed a period of time corresponding to the signal delay;
   a sense amplifier circuit controlled by the timing signal that receives data from the memory array; and
   a data bypass circuit controlled by the timing signal that receives input data from the one or more scanable elements, wherein:
     the data bypass circuit has a data path delay that is representative of the data path delay through the sense amplifier, and
     the received input data is output from the data bypass circuit in response to the timing signal such that the integrated circuit is configured with the memory array bypassed and the output data is delayed to simulate the memory array data propagation delay.

2. The integrated circuit device in claim 1 wherein:
   at least one of the set of scanable elements is a Write Data register that provides Write Data to the memory array in response to the test control signal.

3. The integrated circuit device in claim 1 wherein:
   at least one of the set of scanable elements is coupled to the output of the data bypass circuit to receive the output data.

4. The integrated circuit device in claim 1 wherein:
   the test control signals include a SCAN mode signal that disables the memory array and sense amplifier circuit.

5. The integrated circuit device in claim 1 wherein:
   the test control signals include a Burn-In signal that enables the memory array and disables the sense amplifier circuit.

6. The integrated circuit device in claim 1 wherein:
   the test control signals include a control signal that allows for a simultaneous execution of a memory test and a SCAN test.

7. The integrated circuit device in claim 6 wherein:
   the memory test utilizes BIST.

8. The integrated circuit device in claim 6 wherein:
   the memory test is a memory retention test in which the memory array remains quiescent.

9. The integrated circuit device in claim 1 wherein:
   the memory array includes the delay circuit.

10. The integrated circuit device in claim 9 wherein:
    the delay circuit comprises a dummy row and dummy column.

11. The integrated circuit device in claim 1 further comprising:
    a multiplexer that outputs the timing signal to the sense amplifier circuit or the data bypass circuit as a function of the test control signal.

12. The integrated circuit device in claim 1 wherein:
    the sense amplifier circuit comprises a plurality of transistors, and
    the data bypass circuit comprises a plurality of transistors, less than the plurality of transistors of the sense amplifier, configured and sized to match the data path delay through the sense amplifier.

13. A method of SCAN testing an integrated circuit having a memory with a given memory array data propagation delay and a sense amplifier read data sensing propagation delay that outputs read data to an output node with a read data propagation delay during normal operation of the integrated circuit, said method comprising:
    receiving SCAN test data at a scanable register within the integrated circuit;
    generating a timing enable signal;
    delaying the timing enable signal a period equal to the memory array data propagation delay to produce a timing signal;
    transferring the SCAN test data from the scanable register through a data bypass circuit to the output node, in response to the timing signal, wherein the data bypass circuit introduces a delay in transferring the test data to the output node that represents a read data sensing propagation delay;
    wherein the SCAN test data arrives at the output node with the same propagation delay as the read data propagation delay such that the integrated circuit is at-speed SCAN tested by passing SCAN data through the data bypass circuit rather than the memory but with a timing characteristic equivalent to the memory operating at normal operational speed such that the integrated circuit is at-speed SCAN tested without requiring read operation of the memory.

14. The method in claim 13 further comprising:
    generating a timing enable signal in response to a SCAN mode signal indicating the integrated circuit is being tested in a SCAN mode.

15. The method in claim 13 further wherein:
    the timing enable signal enables a dummy decoder which addresses a dummy element in the memory array.

16. The method in claim 13 further wherein:
    the step of delaying the timing enable signal is performed by a plurality of dummy elements in the memory array.

17. The method in claim 13 further comprising the step of:
    generating a SCAN mode signal that disables a memory array and a sense amplifier of the memory.

18. The method in claim 13 further comprising the step of:
    generating a Burn-In signal that enables a memory array and disables a sense amplifier of the memory.

19. An integrated circuit device comprising:

a test control circuit providing one or more test control signals and a timing enable signal;

a plurality of combinational logic gates;

a set of one or more scanable elements that provide a capability of performing a SCAN test of the plurality of combinational logic gates;

a memory array in a same data path as the set of one or more scanable elements;

a memory control circuit that controls the memory array and provides a capability of performing a memory test of the memory array;

a first testing signal that provides for performing the SCAN; and a second testing signal that disables a portion of the memory control circuit;

wherein:

a combination of the first testing signal and the second testing signal provides a capability of simultaneously performing the SCAN test and the memory test.

20. The integrated circuit device in claim 19 wherein:

the memory test utilizes BIST.

21. The integrated circuit device in claim 19 wherein:

the memory test is a memory retention test in which the memory array remains quiescent.

* * * * *